US005943371A

United States Patent [19]

Beale et al.

[11] Patent Number: 5,943,371

[45] Date of Patent: Aug. 24, 1999

[54] MEMORY EFFICIENT TIME DE-INTERLEAVE, DE-PUNCTURE AND VITERBI DECODER CIRCUITRY

[75] Inventors: Terrance Ralph Beale; Russell Wilbur Pogue, Jr., both of Greentown, Ind.

[73] Assignee: Delco Electronics Corporation, Kokomo, Ind.

[21] Appl. No.: 08/823,917

[22] Filed: Mar. 24, 1997

[51] Int. Cl.[6] .......... H03D 1/00

[52] U.S. Cl. .......... 375/341; 371/43

[58] Field of Search .......... 370/203, 208; 371/37.01, 37.4, 43, 43.7, 30; 375/262, 341

[56] References Cited

U.S. PATENT DOCUMENTS

| | | | |
|---|---|---|---|
| 4,939,734 | 7/1990 | Heichler | 371/43 |
| 5,117,427 | 5/1992 | Miyake et al. | 371/37.1 |
| 5,208,816 | 5/1993 | Seshardi et al. | 371/43 |
| 5,278,844 | 1/1994 | Murphy et al. | 371/37.1 |
| 5,315,583 | 5/1994 | Murphy et al. | 370/18 |
| 5,390,198 | 2/1995 | Higgins | 371/43 |
| 5,408,502 | 4/1995 | How | 375/340 |
| 5,412,694 | 5/1995 | Sato et al. | 375/330 |
| 5,416,787 | 5/1995 | Kodama et al. | 371/43 |
| 5,511,096 | 4/1996 | Huang et al. | 375/265 |

*Primary Examiner*—Stephen Chin
*Assistant Examiner*—Joseph Roundtree, Jr.
*Attorney, Agent, or Firm*—Jimmy L. Funke

[57] ABSTRACT

A memory efficient time de-interleave, de-puncture and viterbi decoder circuit is provided for decoding frames of digital data that is time interleaved over a plurality of data frames, wherein the time interleaved digital data includes convolutionally encoded data. The circuit includes a time de-interleave block having an input receiving a stream of the digital data and an output connected to an input of a de-puncture block, which has an output connected to an input of a viterbi decoder block. The time de-interleave block is adapted for communication with an external memory wherein the time de-interleave block establishes a plurality of address pointers thereto corresponding to the plurality of time interleaved data frames. In accordance with the address pointers, the time de-interleave circuit stores the viterbi metric data for a number of data frames within the external memory in a storage efficient manner. The viterbi decoder circuit preferably utilizes a Radix-4 in-place decoding algorithm and a three bank trellis trace back algorithm that defines a memory efficient three bank reusable circular buffer arrangement. The saved memory may be used to store other information related to the reception and decoding of digital broadcast signals.

11 Claims, 3 Drawing Sheets

MEMORY EFFICIENT TIME DE-INTERLEAVE, DE-PUNCTURE AND VITERBI DECODER CIRCUITRY

CROSS REFERENCE TO RELATED U.S. PATENT APPLICATIONS

The present invention relates to U.S. patent application Ser. No. 08/824,028 which is related to a digital audio broadcasting (DAB) system and being filed concurrently with this invention.

FIELD OF THE INVENTION

The present invention relates generally to techniques for time de-interleaving, de-puncturing and viterbi decoding broadcast digital data, and more specifically to techniques for decoding such data which may be multiplex reconfigured within a given data stream.

BACKGROUND OF THE INVENTION

Digital techniques for the transmission and reception of sound information, sometimes referred to as digital audio broadcasting (DAB), have progressed over the past few years and are anticipated, on a worldwide basis, to replace the present frequency modulation (FM) method of transmitting audio and other information. Digital audio broadcasting (DAB) is not only anticipated to replace FM modulation, but the fidelity of audio signals transmitted and received by DAB systems will be greatly enhanced, making DAB's acceptance welcomed worldwide.

One such DAB technique, the Eureka-147 digital audio broadcasting system, has been accepted around the world as an excellent technical solution for digital sound broadcasting to the mobile environment. The Eureka-147 DAB standard ETS300401 specifies a digital transmission technique for satellite, terrestrial, and cable distribution of sound and data in accordance with the Eureka-147 format.

The Eureka-147 standard ETS300401 specifies a Coded-Orthogonal Frequency Division Multiplex (COFDM) modulation technique, wherein 1.536 MHZ of bandwidth is occupied to combat frequency selective fading to mobile receivers. Such a bandwidth requires the transmission to include several program sources that are time multiplexed.

Referring to FIGS. 2A–2C, the format of broadcast information, in accordance with the Eureka-147 ETS300401 standard, is shown. The digital information 16 depicted in FIG. 2A is defined by data frames of information, such as frame 68, wherein each data frame 68 may be of length 24, 48 or 96 ms. Frame 68 defines a structure having a juxtaposition arrangement that includes a Synchronization Channel 70 which occurs first in time in frame 68, followed by a Fast Information Channel 72, which is followed by a Main Service Channel 74. The Main Service Channel 74 may contain 1, 2 or 4 Common Interleave Frames (CIF) as detailed in ETS300401.

The synchronization channel 70, shown in FIG. 2B, comprises synchronization symbols designated Null Symbol 76 and Time Frequency Phase Reference Symbol 78, which are used to synchronize a Eureka-147 receiver in time and frequency, and to obtain phase referencing. The Fast Information Channel 72 is used to define the Main Service Channel as well as convey several data services, and includes a number of data symbols illustrated in FIG. 2B as data symbols $\mathbf{72}_1, \mathbf{72}_2, \ldots \mathbf{72}_j$. The Fast Information Channel 72 may include either three or eight such data symbols.

Each Common Interleave Frame (hereinafter "CIF") contained within the Main Service Channel 74, such as CIF 80 shown in FIG. 2C, is made up of 55,296 bits which can be individually addressed in 64 bit allocations, or Capacity Units. CIF 80 thus comprises a maximum of 864 such Capacity Units $\mathbf{80}_1, \mathbf{80}_2, \mathbf{80}_3, \ldots \mathbf{80}_{864}$. In accordance with the ETS300401 standard, the 864 Capacity Unit configuration of the CIF 80 is time division multiplexed by several information sources, which can represent compressed music (MPEG data), data in stream mode, or packet-data, wherein any of the information sources can range in data rate from 8–1728 kHz. Prior to time division multiplexing the various information sources onto the data frame 68, the sources are convolutionally encoded and pre-scrambled in time, or time-interleaved, over 16 CIFs (e.g. 384 ms). The resulting encoded information is transmitted for reception by an appropriately configured DAB receiver.

According to the ETS300401 standard, a CIF 80 may be multiplex reconfigured, meaning that the Capacity Units $\mathbf{80}_1$–$\mathbf{80}_{864}$ thereof may be dynamically redefined as they relate to the various information sources. Such dynamic redefinition of the Capacity Units may be manifested in either, or both, of two ways. First, any of the information sources may be moved dynamically to a different set of Capacity Units, wherein such moves may occur as frequently as once every six (6) seconds. A source occupying Capacity Units 50–79 may thus be moved, for example, to occupy Capacity Units 70–99. Secondly, an information source's data rate may increase or decrease at these same six second intervals. A source having a data rate requiring occupation of 30 Capacity Units may thus be dynamically decreased in data rate to require occupation of, for example, only 24 Capacity units, or may be increased in data rate to require occupation of, for example, 36 Capacity Units.

A DAB receiver must be capable of receiving the transmitted signals described hereinabove, synchronize with such signals in both time and carrier frequency, and decode the signal sources for replication of the original information. A Eureka-147 DAB receiver must therefore be able to time de-interleave 16 CIFS, de-puncture and viterbi decode the convolutional data, and store the decoded data for presentation to a data decoder or MPEG decoder at the various information sources' data rates.

In time de-interleaving (descrambling) such signals, known Eureka-147 based receiver systems typically utilize a single pointer arrangement to a memory unit which contains 16 CIFs of metric data at any time during the decoding process. Such brute force time de-interleaving techniques require a substantial amount of memory, thereby increasing the cost of the receiver 10. What is therefore needed is an efficient technique for time de-interleaving, de-puncture and viterbi decoding broadcast Eureka-147 based DAB information which minimizes memory required therefore.

SUMMARY OF THE INVENTION

The time de-interleave, de-puncture and viterbi decoder circuitry of the present invention addresses the needs and concerns set forth in the BACKGROUND section. In accordance with one aspect of the present invention, a time de-interleave, de-puncture and viterbi decoder circuit comprises a time de-interleave circuit adapted for communication with a memory circuit, which has an input receiving a stream of digital data defined by a plurality of time interleaved frames of encoded data samples and metric data samples. The time de-interleave circuit defines a corresponding plurality of address pointers to the memory circuit and is operable to compactly store a number of the plurality of time interleaved frames of metric data samples therein according to addresses defined by a corresponding number of the plurality of address pointers. The time de-interleave circuit is operable to process the stored metric data samples and produce time de-interleaved data samples at an output thereof. A de-puncture circuit is further included and has an input connected to the time de-interleave circuit output, wherein the de-puncture circuit is operable to de-puncture the time de-interleaved data samples and produce time de-interleaved and de-punctured data samples at an output thereof. A viterbi decoder circuit is further included and has an input connected to the de-puncture circuit output, wherein the viterbi decoder circuit is operable to viterbi decode the time de-interleaved and de-punctured data samples and produce time de-interleaved, de-punctured and viterbi decoded data samples at an output thereof.

One object of the present invention is to provide a time de-interleave, de-puncture and viterbi decoder circuit that minimizes memory required therefore and utilizes available memory in a memory efficient manner.

Another object of the present invention is to provide such a time de-interleave, de-puncture and viterbi decoder circuit composed of series arranged circuit blocks to allow for multiple programs to be decoded while minimizing redundant parallel hardware.

Yet another object of the present invention is to provide such a time de-interleave, de-puncture and viterbi decoder circuit wherein the viterbi decoder circuit block utilizes a memory efficient three bank trace-back trellis algorithm.

These and other objects of the present invention will become more apparent from the following description of the preferred embodiment.

DESCRIPTION OF THE PREFERRED EMBODIMENT

Figure 1:
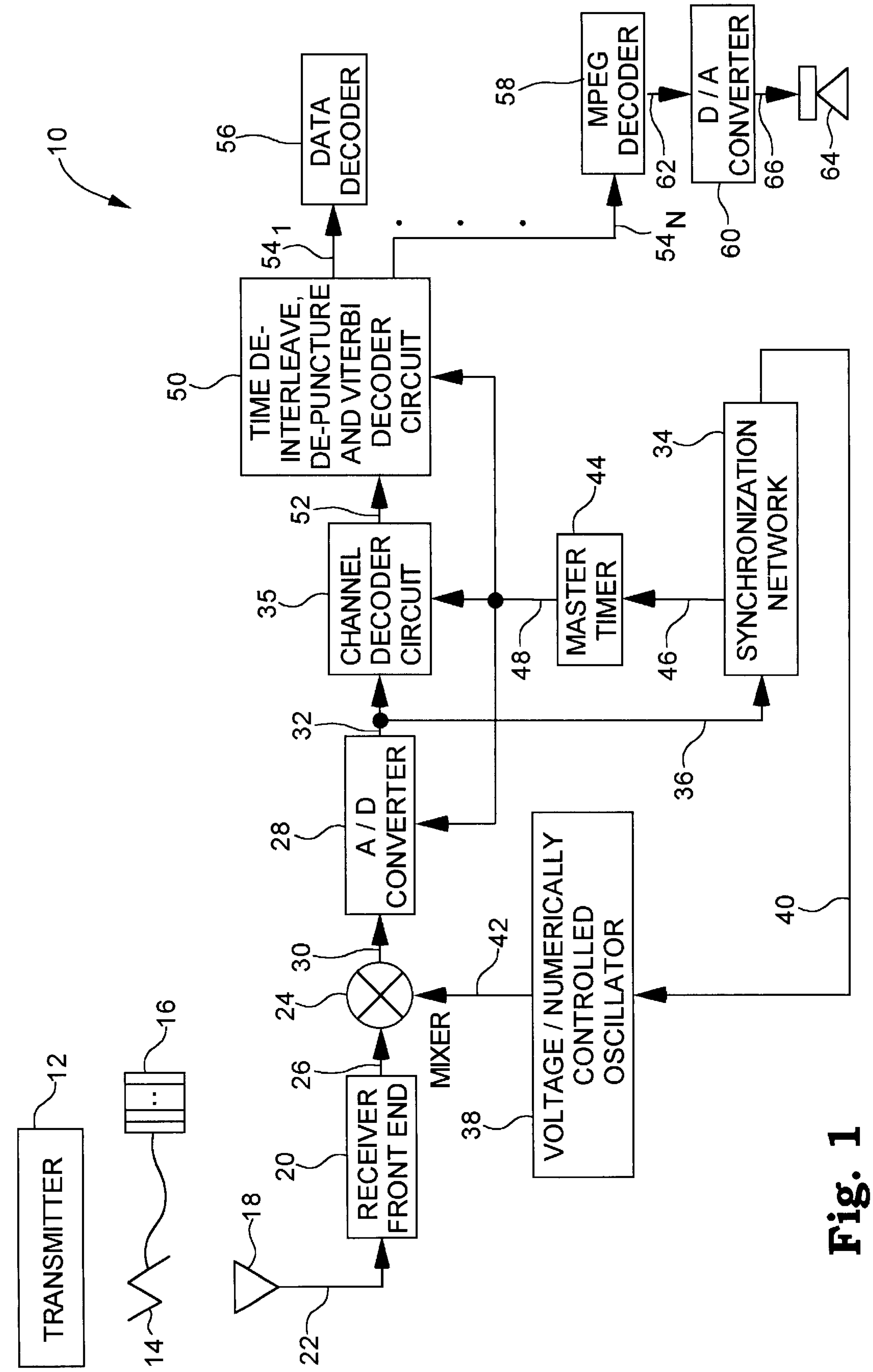
FIG. 1 is a block diagram of one embodiment of a broadcast data receiver particularly suited for reception of COFDM modulated data, incorporating a time de-interleave, de-puncture and viterbi decoder circuit in accordance with the present invention.

For the purposes of promoting an understanding of the principles of the invention, reference will now be made to the embodiment illustrated in the drawings and specific language will be used to describe the same. It will nevertheless be understood that no limitation of the scope of the invention is thereby intended, such alterations and further modifications in the illustrated device, and such further applications of the principles of the invention as illustrated therein being contemplated as would normally occur to one skilled in the art to which the invention relates.

Referring now to FIG. 1, one embodiment of a broadcast data receiver 10, particularly suited for reception of COFDM modulated data, is shown. Receiver 10 includes a known transmitter 12, operable to transmit a digital data stream 14, such as COFDM modulated data 16, which is received by antenna 18. Antenna 18, in turn, routes the received information to a known receiver front end 20 via signal path 22. The receiver front end 20 may have amplifying means to amplify the received signals as is known in the art, and routes such received/amplified signals to a known mixer 24 by way of signal path 26. The mixer 24, in response to the information signal provided thereto via signal path 26 and a feedback signal provided thereto by a known voltage/numerically controlled oscillator 38 via signal path 42, combines these input signals and develops an output signal whose frequency is roughly equal to the difference between the frequencies of its input signals, and routes such an output signal to a known A/D converter 28 by way of signal path 30. Mixer 24 thus provides a frequency-adjusted analog signal that is routed to the A/D converter 28. The digital quantities generated by the A/D converter 28 are routed, by way of signal path 32, to a channel decoder circuit 35 and to a known synchronization network 34 via signal path 36. Channel decoder circuit 35, in turn, provides a channel decoded signal to the time de-interleave, de-puncture and viterbi decoder circuit 50 of the present invention via signal path 52. The channel decoded signal provided by channel decoder circuit 35 consists of multiplexed input time samples, representing in-phase and quadrature time components, and output soft-decision metrics representing the decoded frequency domain samples in time correct order. An example of one embodiment of such a channel decoder 35 is described in related U.S. patent application Ser. No. 08/824,028 entitled MEMORY EFFICIENT CHANNEL DECODING CIRCUITRY, which is assigned to the assignee of the present invention, and which patent application is herein incorporated by reference. In accordance with the present invention, and as will be described in greater detail hereinafter, the channel decoded signal provided by channel decoder circuit 35 on signal path 52 enters a time de-interleave, de-puncture and viterbi decoding process within circuit 50.

Synchronization network 34 provides a synchronization signal to voltage/numerically controlled oscillator 38 via signal path 40, and further provides a timing signal to a known master timer 44 via signal path 46. The master timer 44, sometimes referred to as a master clock, by means of its output signal on signal path 48 controls the sample timing by which all of the interconnected elements, such as A/D converter 28, channel decoder circuit 35 and time de-interleave, de-puncture and viterbi decoder circuit 50, sample their associated signals. In operation, the feedback loop established between A/D converter 28 and mixer 24, by way of synchronization network 34 and voltage/numerically controlled oscillator 38, synchronizes receiver 10 with the received signal 14 both in time and in frequency. Master timer 44 is responsive to the timing signal provided thereto by synchronization network 34 to produce the master timing signal on signal path 48. The A/D converter 28, channel decoder circuit 35 and time de-interleave, de-puncture and viterbi decoder circuit 50 are, in turn, responsive to the master timing signal on signal path 48 to process the received signal 14 in a time-synchronized manner.

The synchronization network 34 and voltage/numerically controlled oscillator 38 are responsive to the signal provided thereto via signal path 36 to acquire a "rough" frequency synchronization with the received signal 14. Such an arrangement permits the receiver 10 to achieve a frequency lock of within a few carriers of the transmitted signal's frequency. The ETS300401 standard, however, requires a frequency lock of better than the frequency spacing between each of the multiple carriers, which translates to a frequency lock requirement of better than 0.02 * carrier spacing. In a preferred embodiment of broadcast data receiver 10, channel decoder circuit 35 is operable to improve the frequency synchronization, in accordance with digital automatic frequency control (AFC) techniques, to achieve a frequency lock with the transmitted signal of better than 0.02 * carrier spacing as required for data reliability.

The time de-interleave, de-puncture and viterbi decoder circuit 50 provides a number, N, of digital output signals on signal paths $54_1$, . . . $54_N$ for subsequent source decoding thereof, wherein N corresponds to the number of sources of information. The decoded information available on any given signal path $54_k$ may be either music information or other digital data. If the decoded information is digital data other than music, the signal path is routed to a data decoder 56, such as illustrated by signal path $54_1$, in FIG. 1. If the decoded information is music information, such as that present on signal path $54_N$, the signal path is routed to an MPEG decoder 58 of known construction. The MPEG decoder 58 is connected to a D/A converter 60 via signal path 62, and the D/A converter 60, in turn, provides an analog output signal to speaker 64 via signal path 66 for audio reproduction of the transmitted signal.

Figure 2C:
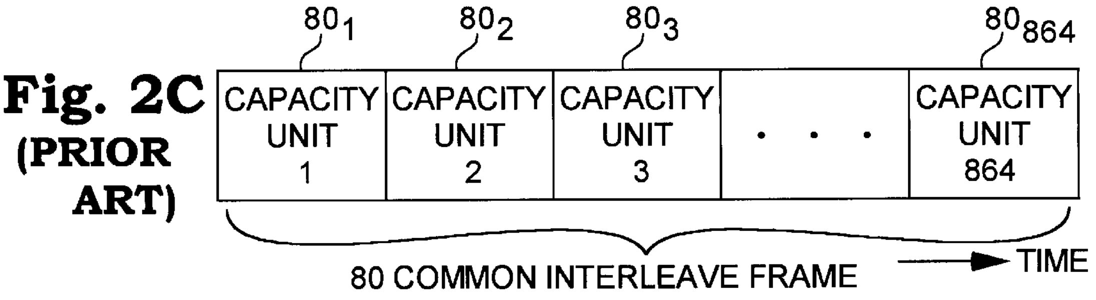
Fig. 2C (PRIOR ART)
Figure 3:
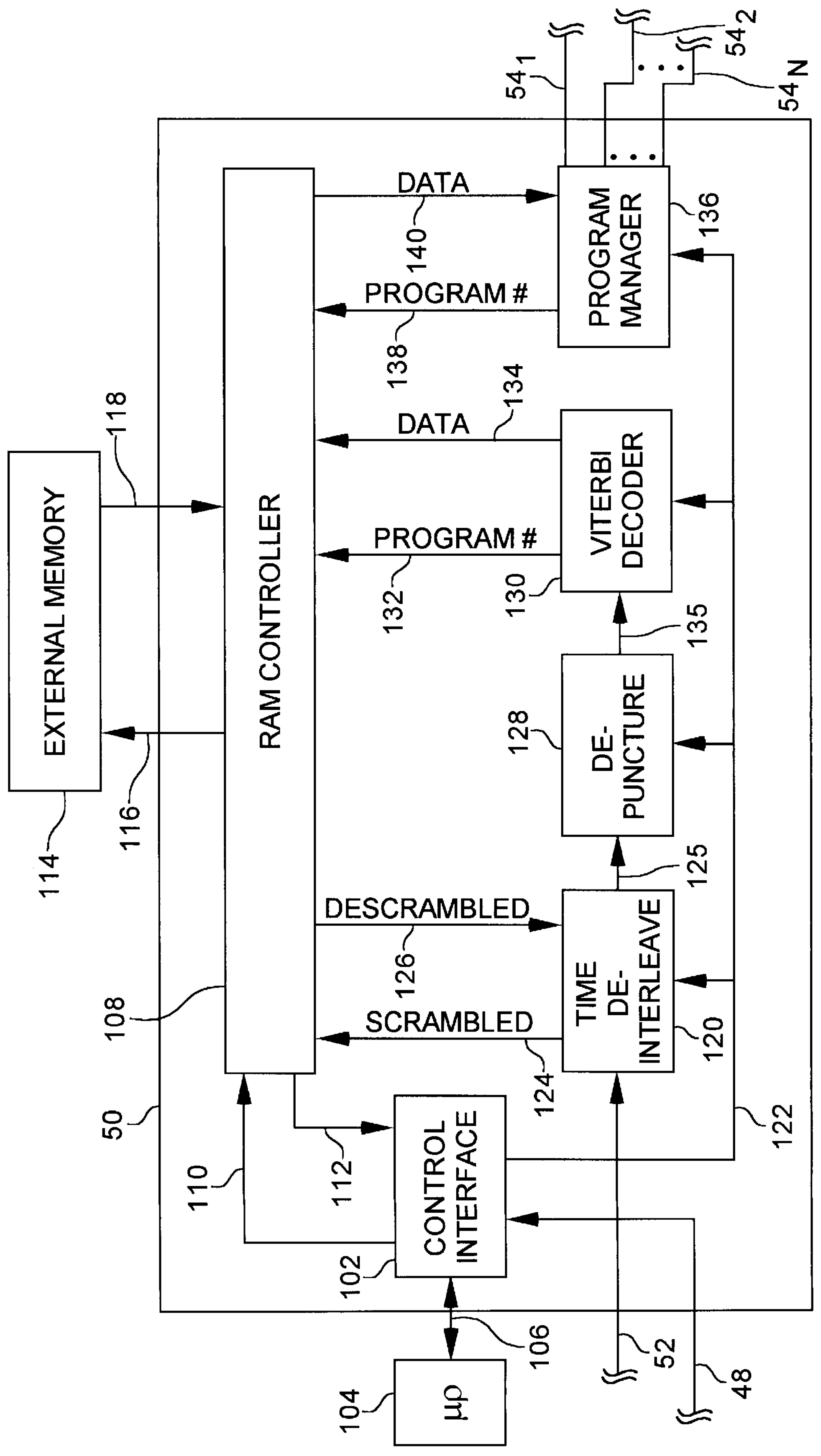
FIG. 3 is a block diagram illustrating one embodiment of a time de-interleave, de-puncture and viterbi decoder circuit of the present invention.

Referring now to FIG. 3, a preferred embodiment of a time de-interleave, de-puncture and viterbi decoder circuit 50, in accordance with the present invention, is shown. Time de-interleave, de-puncture and viterbi decoder circuit 50 is operable to interface with an external microprocessor 104 of known construction and a known external memory 114 to provide decoded, albeit compressed, data on signal paths $54_1$, $54_2$, . . . $54_N$. In accordance with an important aspect of the present invention, efficient use is made of the external memory 114 so that any unused portion thereof may be used to store other information such as Fast Information Channel 72 (FIC) data or FIC decoded data, or to establish special purpose blocks thereof such as a program number configuration area, for example. Since external memories 114 are typically commercially available only in increments of $2^n$ k-bytes or M-bytes, wherein n=0, 1, 2, . . ., etc, the memory efficient techniques of the present invention can make a considerable amount of the external memory 114 available for such use. In any event, circuit 50 is operable to time de-interleave 16 CIFs 80 (FIG. 2C) of data, de-puncture and viterbi decode the convolutionally encoded data, and store the resulting data for subsequent decoding/decompression by data 56 and/or MPEG 58 decoders. The decoded data provided by circuit 50, however, must be presented to the data 56 and/or MPEG 58 decoders at the corresponding information source's data rate for proper reproduction of the original data.

Circuit 50 includes a control interface circuit 102 having a first input connected to the microprocessor 104 via signal path 106 and a second input connected to signal path 48. Master timer 44 is responsive to synchronization network 34 to provide a master clock signal on signal path 48 corresponding to reception of each new frame 68 of data. In this manner, time de-interleave, de-puncture and viterbi decoder circuit 50 is time synchronized with the remaining elements of receiver 10. A first output of control interface 102 is connected to time de-interleave block 120, de-puncture block 128, viterbi decoder block 130 and program manager block 136 via signal path 122, whereby control interface circuit 102 provides decoding information to these various blocks in accordance with the program currently being decoded.

Control interface 102 includes a second output connected to a first input of RAM controller 108 via signal path 110, and a third input connected to a first output of RAM controller 108 via signal path 112. As will be described in greater detail hereinafter, control interface circuit 102 provides decoding information to, and receives decoding information from, RAM controller 108 via signal paths 110 and 112 respectively.

RAM controller 108 includes a second output connected to an input of an external memory 114 via signal path 116, and a second input connected to an output of external memory 114 via signal path 118. RAM controller 108 is operable to provide information to, and receive information from, external memory 114 via signal paths 116 and 118 respectively. A third input of RAM controller 108 is connected to a first output of time de-interleave block 120 via signal path 124 to receive scrambled (time interleaved) data therefrom, and a third output of RAM controller 108 is connected to a second input of time de-interleave block 120 via signal path 126 for providing descrambled (de-interleaved) data thereto. Fourth and fifth inputs of RAM controller 108 are connected to first and second outputs of viterbi decoder via signal paths 132 and 134 to receive program number and data information respectively therefrom. A sixth input of RAM controller 102 is connected to a control signal output of program manager block 136 via signal path 138 to receive program number information therefrom, and a fourth output of RAM controller 108 is connected to a second input of program manager block 136 via signal path 140 for providing data thereto.

Time de-interleave block 120 includes a third input connected to signal path 52 (FIG. 1) for receiving channel decoded data from channel decoder circuit 35 discussed hereinabove, and a second output connected to a second input of de-puncture block 128 via signal path 125. An output of de-puncture block 128 is connected to a second input of viterbi decoder block 130 via signal path 135, and the program manager block 136 provides digital decoded data from circuit 50 on signal paths $54_1$–$54_N$ as discussed hereinabove.

In operation, the microprocessor 104 has prior knowledge of the various program numbers/values selected by the operator, and the microprocessor 104 feeds this information to the control interface circuit 102 via signal path 106. For each such program number, the microprocessor 104 also feeds decoding information to the control interface 102, and the control interface 102 stores this information into external memory 114 via signal path 110. As a particular program is to be decoded, the control interface circuit 102 feeds this decoding information to the time de-interleave 120, de-puncture 128, viterbi decoder 130 and program manager 136 blocks via signal path 122. Examples of such decoding information include address locations of the metric data within external memory 114 for the particular program number to be decoded, corresponding de-puncture values, and program number.

The time de-interleaving operation of the present invention stores into external memory 114 an entire CIF 80 of viterbi metric data generated by the channel decoder circuit 35. In so doing, viterbi metric data for a given CIF 80 of data is received by time de-interleave block 120 via signal path 52, and is provided to RAM controller 108 via signal path 124. RAM controller 108 is then responsive to control signals provided thereto by control interface circuit 102 on signal path 110 to store the viterbi metric data into external memory 114. The time de-interleave block 120 is subsequently operable to periodically pull bits of the metric data from external memory 114, via signal path 118 to RAM controller 108, and through signal path 126 to time de-interleave block 120, according to a de-interleaving procedure defined by Eureka-147 DAB standard ETS300401, which standard is incorporated herein by reference.

In managing the ETS300401 defined de-interleaving procedure, microprocessor 104 includes therein a software algorithm that partitions external memory 114 into 16 separate blocks. The algorithm establishes 16 separate address pointers to the external memory 114, wherein a separate pointer is used for each of the data values in the CIF 80, arranged modulo 16, that are time interleaved according to the Eureka-147 transmission process. Via signal path 106, microprocessor 104 is operable to direct control interface circuit 102 to manipulate and keep track of the address locations of each of the 16 pointers via signal paths 110 and 112. By keeping track of the 16 address pointers into memory, one for each delay tap of the time de-interleave block in the transmitted signal generation, the amount of memory for each delay tap is optimized so that no metric samples that have been previously used will remain in external memory 114. While such memory optimization may easily be accomplished for a static data configuration, it is complicated by the requirement that any CIF 80 may be multiplex reconfigured as discussed hereinabove. In accordance with the present invention, memory optimization for multiplex reconfigurable CIFs is accomplished by keeping track of which CIF 80 of the reconfiguration process the decoding procedure is currently decoding, and by establishing and keeping track of previous and current Capacity Unit offset values. Such a decoding management scheme is controlled by microprocessor 104 and executed within circuit 50 via control interface circuit 102.

The rate of the time de-interleave process performed by time de-interleave block 120 is set by the decoding rate of the viterbi decoder block 130. In general, the time de-interleave block 120 must pull metric data from external memory 114, via signal path 126, at a rate that is fast enough to keep up with the viterbi decoder rate. In a Eureka-147 system, viterbi decoder block 130 may operate at a maximum code rate of ¼, which requires that four metric data points be pulled from external memory 114 for every convolutionally encoded data point provided to circuit 50 via signal path 52. In one embodiment, viterbi decoder block 130 is operable to decode at a maximum rate of approximately 2.0 Mbps, thereby imposing a maximum instantaneous rate requirement on time de-interleave block 120 of approximately 8.0 M-metrics per second.

The time de-interleave block 120 feeds de-puncture block 128 via signal path 125, wherein de-puncture block 128 is preferably fully reconfigurable by control interface circuit 102 via circuit path 122. In accordance with the ETS300401 standard, the de-puncture block 128 must be capable of de-puncturing up to 24 separate code rates of between ¼ and 8/9. This requirement thus imposes a further requirement that each set of 32 metric data bits carry 0–23 “don’t cares” therewith, wherein the de-punctured data is passed to the viterbi decoder block 130 which generates 8 decoded data bits for every set of 32 metric data bits.

The de-puncture block 128 feeds viterbi decoder block 130 via signal path 135, wherein the viterbi decoding process preferably utilizes a Radix-4 in-place calculation of metric states, in accordance with another aspect of the present invention. A convolutional code constraint length of 7, imposed by the ETS300401 standard, requires the calculation of 64 states to determine one decoded data bit. Each of the 64 state is calculated using four metric data bits provided by the de-puncture block 128. The Radix-4 in-place algorithm calculates four such states in parallel, thus requiring 16 system clocks in a preferred embodiment of circuit 50 to decode the 64 states per decoded data bit. The state metrics are calculated in-place such that only one memory block (within external memory 114) of 64 states is required to decode the state transitions. Such an implementation is an improvement over known prior art viterbi decoding techniques which typically decode at maximum rates of approximately 384 kbps, and wherein decoding more than one program, or source, requires additional viterbi decoder hardware. The viterbi decoder technique of the present invention, by contrast, is capable of decoding the full-channel data capability of between 8–1728 kbps. The Radix-4 in-place calculation of state metrics thus allows for multiple programs to be decoded in series, thereby minimizing redundant parallel hardware architecture. In accordance with the Radix-4 in-place algorithm, the viterbi decoder block 130 bursts program numbers and data into the external memory 114, via the RAM controller 108, by way of signal paths 132 and 134 respectively.

In accordance with another aspect of the present invention, the viterbi decoding process preferably partitions external memory 114 into a known three-bank trellis memory, and the decoder 130 implements a known trace-back algorithm in which the memory banks are re-used in a circular buffer fashion to accommodate multiple block lengths of viterbi data. Such an algorithm further allows for larger trellis lengths than currently known memory implementations, thereby providing improved performance for higher punctured convolutional codes. The trellis trace-back algorithm stores the trellis data into external memory 114, which results in efficient memory organization as compared to known register exchange algorithms typically used in known prior art viterbi decoding algorithms.

In accordance with the trellis memory implementation of the present invention, the trellis memory required is three times the trellis depth. The organization of external memory 114 is thus three banks of this depth. The algorithm is operable to trace back to previously stored values, according to known trellis trace-back techniques, only after the trellis data has been accumulated two banks deep. While the trace-back occurs, the third bank of memory is filled with the concurrent decoded trellis values, which thereby reduces the amount of redundant trace-backs that must be performed. As a result, each trace-back only needs to access the trellis memory twice per trace-back. Finally, the three banks of external memory 114 are utilized by viterbi decoder block 130 in a circular buffer fashion so that trellis vectors of any length can be easily block decoded.

The Program manager block 136 is operable to receive decoded data from a corresponding program number from the external memory 114 via the RAM controller 108 by way of signal paths 140 and 138 respectively. The program manager block 136 is responsive to each program number provided thereto by control interface block 102 via signal path 122, to retrieve data from external memory 114 corresponding thereto at a rate defined by that particular program number. In the viterbi decoding process performed by viterbi decoder block 130, viterbi decoded data for any of a number of programs (identifiable by program numbers or other program identifiers) are stored into external memory 114 according to a pre-established memory map. The program manager 136 is then operable to pull such data from external memory 114 for each program number or identifier according to a data rate defined by each program number or identifier. The program manager provides the time de-interleaved, de-punctured and viterbi decoded data for the various programs on signal paths $54_1$–$54_N$ as discussed hereinabove.

Figure 2A:
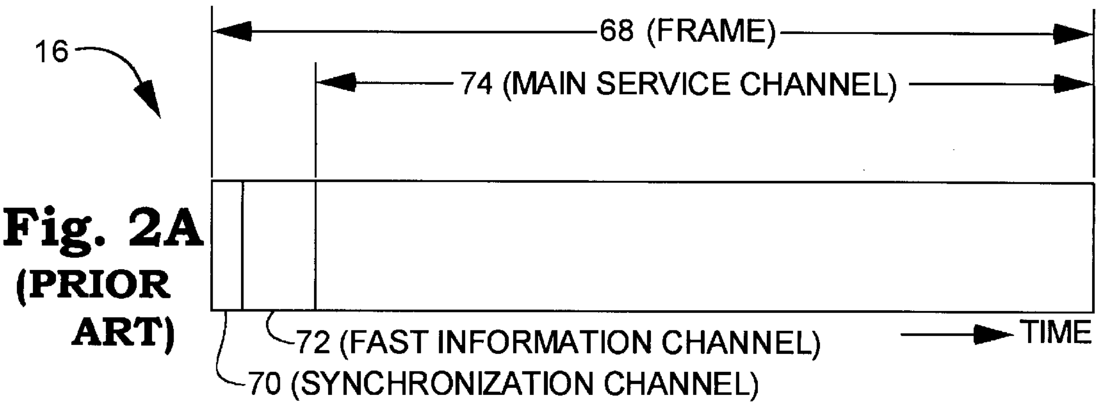
Fig. 2A (PRIOR ART)
FIG. 2 is composed of FIGS. 2A, 2B and 2C and illustrates a known data frame structure of the digital information transmitted by the transmitter of FIG. 1 and received by the receiver of FIG. 1.
Figure 2B:
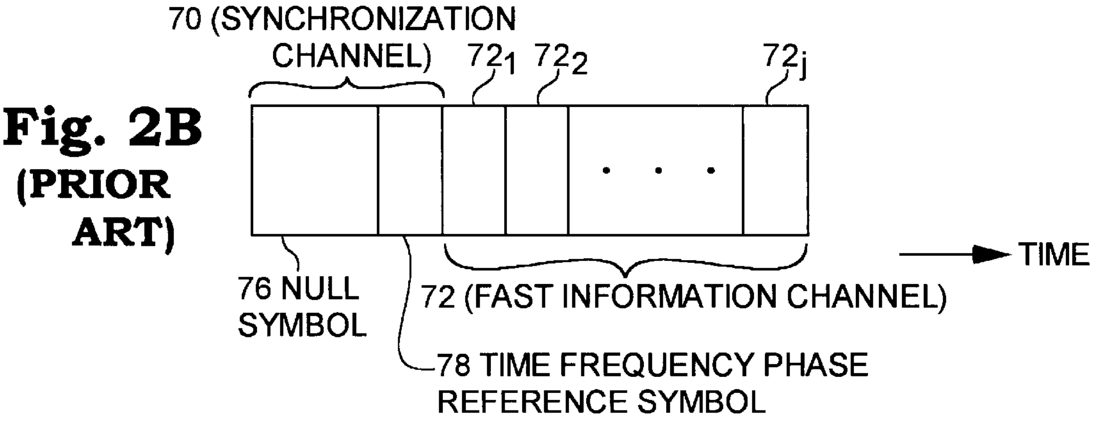
Fig. 2B (PRIOR ART)

It should be appreciated that the decoding blocks 120, 128 and 130 of time de-interleave, de-puncture and viterbi decoder circuit 50 are all capable of being used in series to decode several programs, which combined do not exceed a decoded data rate of over the viterbi decoder block 130 code rate (preferably 2 Mbps). Such a configuration provides for a reduction in redundant parallel hardware comprising known prior art systems. The same decoding hardware used to decode the series of CIF 80 programs may further be used to decode the Fast Information Channel 72 (FIGS. 2A and 2B).

Further, by utilizing existing external memories, a low-cost implementation of memory required in the DAB decoding process is obtained. By sharing the external memory in using the saved memory contents of the de-interleave process, further buffering is not required in the data decoders which require the data to be provided thereto at a specified lower data rate rather than at the fast-burst viterbi decoder rate.

While the invention has been illustrated and described in detail in the drawings and foregoing description, the same is to be considered as illustrative and not restrictive in character, it being understood that only the preferred embodiment has been shown and described and that all changes and modifications that come within the spirit of the invention are desired to be protected. For example, while the time de-interleave, de-puncture and viterbi decoder circuit 50 of the present invention may be constructed of known discrete electrical components or formed of a single custom integrated circuit, it is preferably combined with channel decoder circuit 35 to form a single custom integrated circuit according to known semiconductor fabrication processes.

The embodiments of the invention in which an exclusive property or privilege is claimed are defined as follows:

1. Time de-interleave, de-puncture and viterbi decoder circuitry, comprising:

a time de-interleave circuit adapted for communication with a memory circuit and having an input receiving a stream of digital data defined by a plurality of time interleaved frames of encoded data samples and metric data samples, said time de-interleave circuit defining a corresponding plurality of address pointers to the memory circuit and compactly storing a number of said plurality of time interleaved frames of metric data samples therein according to addresses defined by a corresponding number of said plurality of address pointers, said time de-interleave circuit processing the stored metric data samples and producing time de-interleaved data samples at an output thereof;

a de-puncture circuit having an input connected to said time de-interleave circuit output, said de-puncture circuit de-puncturing the time de-interleaved data samples and producing time de-interleaved and de-punctured data samples at an output thereof; and a viterbi decoder circuit having an input connected to said de-puncture circuit output, said viterbi decoder circuit viterbi decoding the time de-interleaved and de-punctured data samples and producing time de-interleaved, de-punctured and viterbi decoded data samples at an output thereof.

2. The time de-interleave, de-puncture and viterbi decoder circuitry of claim 1 wherein said viterbi decoder circuit is adapted for communication with said memory circuit, said viterbi decoder circuit storing said time de-interleaved, de-punctured and viterbi decoded data samples in said memory circuit.

3. The time de-interleave, de-puncture and viterbi decoder circuitry of claim 2 further including a program manager circuit having a first output adapted for communication with said memory circuit and producing a program identifier thereat, said program manager circuit having a first input adapted for communication with said memory circuit and receiving time de-interleaved, de-punctured and viterbi decoded data samples therefrom according to said program identifier, said program manager circuit retrieving said time de-interleaved, de-punctured and viterbi decoded data samples from said memory circuit at a rate defined by said program identifier and producing said data samples at a data output thereof.

4. The time de-interleave, de-puncture and viterbi decoder circuitry of claim 3 wherein said program manager circuit includes a plurality of data outputs;

and wherein said program manager circuit is operable to produce a number of program identifiers at said first output, retrieve time de-interleaved, de-punctured and viterbi decoded data samples from said memory circuit according to said number of program identifiers at rates defined by each of said program identifiers, and produce said data samples corresponding to each of said program identifiers at a separate data output thereof.

5. The time de-interleave, de-puncture and viterbi decoder circuitry of claim 4 further including a control interface circuit operable to produce data decoding information at a first output thereof;

and wherein each of said time de-interleave circuit, said de-puncture circuit, said viterbi decoder circuit and said program manager circuit include a control input connected to said first control interface circuit output for receiving said data decoding information.

6. The time de-interleave, de-puncture and viterbi decoder circuitry of claim 5 wherein said time de-interleave circuit, said de-puncture circuit, said viterbi decoder circuit, said program manager circuit and said control interface circuit each form a portion of a single integrated circuit.

7. Time de-interleave, de-puncture and viterbi decoder circuitry comprising:

a time de-interleave circuit having an input receiving a stream of digital data defined by a plurality of time interleaved frames of encoded data samples and an output producing time de-interleaved data samples;

a de-puncture circuit having an input connected to said time de-interleave circuit output and an output, said de-puncture circuit receiving said time de-interleaved data samples at said input thereof and producing time de-interleaved and de-punctured data samples at said output thereof;

a viterbi decoder circuit having an input connected to said de-puncture circuit output and a number of outputs, said viterbi decoder circuit receiving said time de-interleaved and de-punctured data samples at said input thereof and producing a program identifier along with time de-interleaved, de-punctured and viterbi decoded data samples for each of a number of data programs at said number of outputs thereof; and a program manager circuit having a number of inputs receiving program identifiers along with time de-interleaved, de-punctured and viterbi decoded data samples for each of said number of data programs, and a number of outputs, said program manager producing time de-interleaved, de-punctured and viterbi decoded data samples for each of said number of programs at a rate defined by a corresponding one of said program identifiers at a separate one of said number of outputs thereof.

8. The time de-interleave, de-puncture and viterbi decoder circuitry of claim 7 further including a memory circuit in communication with said time de-interleave circuit, said viterbi decoder circuit and said program manager circuit, said memory circuit storing time interleaved data samples provided thereto by said time de-interleave circuit and providing time de-interleaved data samples to said time de-interleave circuit for further processing thereof.

9. The time de-interleave, de-puncture and viterbi decoder circuitry of claim 8 wherein said memory circuit is further operable to store data samples therein produced by said viterbi decoder circuit, said memory circuit storing said data samples produced by said viterbi decoder circuit in a circular buffer fashion to accommodate various block lengths of said data samples produced by said viterbi decoder circuit.

10. The time de-interleave, de-puncture and viterbi decoder circuitry of claim 9 wherein a portion of said memory circuit is arranged as a three-bank trellis for storing said data samples produced by said viterbi decoder circuit therein, said viterbi decoder circuit storing said data samples produced thereby in said three-bank trellis in accordance with a trellis trace back algorithm.

11. The time de-interleave, de-puncture and viterbi decoder circuit of claim 9 wherein said viterbi decoder circuit produces said time de-interleaved, de-punctured and viterbi decoded data samples for each of said number of data programs in accordance with a Radix-4 in-place calculation of state metrics, thereby minimizing parallel hardware necessary for time de-interleaving, de-puncturing and viterbi decoding a plurality of data programs.

* * * * *